United States Patent [19]
Hirano et al.

[11] Patent Number: 5,985,521
[45] Date of Patent: *Nov. 16, 1999

[54] METHOD FOR FORMING ELECTRICALLY CONDUCTIVE LAYERS ON CHIP CARRIER SUBSTRATES HAVING THROUGH HOLES OR VIA HOLES

[75] Inventors: Yasuo Hirano, Ohmihachiman; Yoshiyuki Naitoh, Moriyama; Shigeaki Yamashita, Shiga-ken, all of Japan

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/775,739

[22] Filed: Dec. 30, 1996

[30] Foreign Application Priority Data

Feb. 29, 1996 [JP] Japan .................................. 8-042409

[51] Int. Cl.$^6$ ........................................................ G03F 7/00
[52] U.S. Cl. ...................... 430/314; 430/313; 430/318; 427/97; 438/667; 216/18
[58] Field of Search ............................ 427/97; 438/667; 216/18; 430/313, 314, 318

[56] References Cited

U.S. PATENT DOCUMENTS

| | | | |
|---|---|---|---|
| 4,211,603 | 7/1980 | Reed | 427/97 |
| 4,642,160 | 2/1987 | Burgess | 427/97 |
| 4,770,900 | 9/1988 | Seibel | 427/97 |
| 4,983,252 | 1/1991 | Masui et al. | 430/313 |
| 5,236,810 | 8/1993 | Kondo et al. | 430/313 |
| 5,427,895 | 6/1995 | Magnuson et al. | 430/314 |
| 5,504,992 | 4/1996 | Fukutomi et al. | 427/97 |

FOREIGN PATENT DOCUMENTS 3-255693  11/1991  Japan .

*Primary Examiner*—Janet Baxter
*Assistant Examiner*—Jill N. Holloman
*Attorney, Agent, or Firm*—Schmeiser, Olsen & Watts; Lawrence R. Fraley

[57] ABSTRACT

A method for fabricating a chip carrier, such as a printed circuit board, which includes at least one through hole or via hole, is disclosed. In accordance with this method, an electrically conductive layer is formed on at least one of the major surfaces of the corresponding chip carrier substrate, as well as for the surface of the through hole or via hole. Significantly, the electrically conductive layer on the at least one major surface is relatively thin, which permits the formation of a relatively high density of circuit lines in this layer. On the other hand, the electrically conductive layer on the surface of the through hole or via hole is relatively thick, which prevents the formation of defects in this layer.

19 Claims, 8 Drawing Sheets

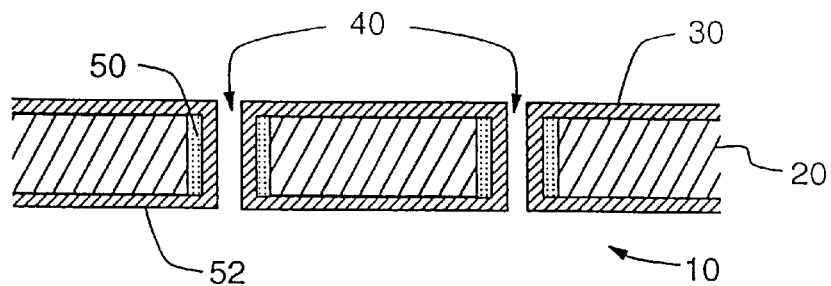
FIG. 8
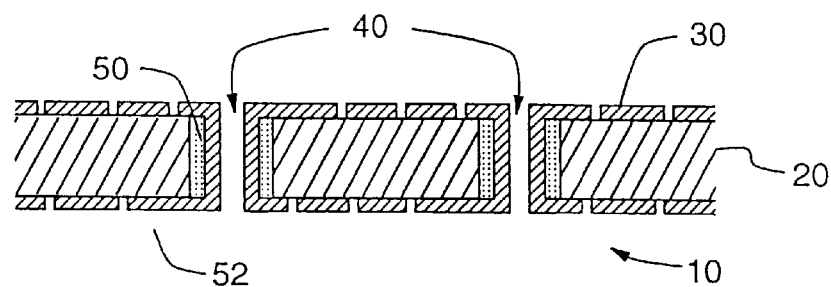
FIG. 9
FIG. 10
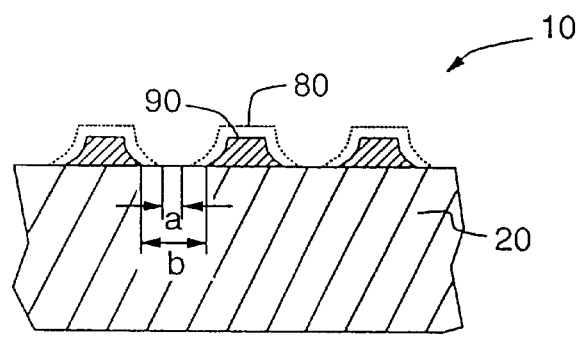

PRIOR ART

METHOD FOR FORMING ELECTRICALLY CONDUCTIVE LAYERS ON CHIP CARRIER SUBSTRATES HAVING THROUGH HOLES OR VIA HOLES

BACKGROUND OF THE INVENTION

1. Field of the Invention

The present invention relates to a method for forming an electrically conductive layer on a chip carrier substrate, such as a printed circuit board substrate, and, more particularly, to a method for forming an electrically conductive layer on a chip carrier substrate having through holes or via holes.

2. Description of the Related Art

To increase the component density of a chip carrier, such as a printed circuit board or a printed circuit card, on which electronic components such as integrated circuit (IC) chips are to be mounted, so-called double face mounting, in which electronic components are mounted on both the upper and lower surfaces of the chip carrier, is now practiced. In double face mounting, a chip carrier substrate is provided with through holes, that is, holes extending through the thickness of the substrate, to establish electrical connections between circuit patterns on opposite surfaces of the substrate.

In a substrate having through holes, the internal surface of each through hole is covered by a conductive layer which extends to the circuit patterns on the opposing upper and lower surfaces of the substrate, whereby the circuit patterns on the two surfaces are electrically connected to each other.

Multilayer chip carrier substrates to which patterned conductive layers (circuitry patterns) are laminated are also used to attain high component densities. Such a multilayer substrate includes, for example, via holes, that is, small holes extending from a conductive layer on the substrate surface to a conductive layer internal to the substrate. In such a substrate, a conductive layer provided on the internal surface of each via hole electrically connects the conductive layer on the substrate surface to the conductive layer in the substrate.

The conductive layer provided on the internal surface of a through hole or via hole is conventionally formed simultaneously and integrally with the conductive layer on the substrate surface by so-called plating, that is, depositing metal such as copper typically through a chemical reaction.

When a conductive layer on a chip carrier substrate is formed by plating, because the diameter of each through hole or via hole is small, the metal-containing solution fails to fully penetrate into the hole, so that the conductive layer formed on the internal surface of the through hole or via hole tends to be thinner than the conductive layer simultaneously formed on the substrate surface.

The thinner conductive layer in the through hole or via hole often includes defects such as pinholes or cracks, leading to an open circuit, which is obviously undesirable in an electrical connection. Therefore, the conductive layer in the through hole or via hole needs to have sufficient thickness to assure a continuous electrical connection. Thus, it is normal practice to extend the plating time so that a sufficient thickness is achieved for the conductive layer in the through hole or via hole to avoid pinholes or cracks.

However, when the plating time is extended, not only is the thickness of the conductive layer in the through hole or via hole increased, but the conductive layer on the substrate surface becomes undesirably thick, leading to the following problem. For a substrate with through holes, for example, as shown in FIG. 21, the spacing between the circuit lines formed in a conductive layer 200 (which spacing is indicated by reference d in FIG. 21) on the substrate surface is reduced during the etching of these circuit lines into the conductive layer, leading to the occurrence of short circuits between the circuit lines. Similar problems also arise in a substrate with via holes. The reason why such a problem arises is because the etching procedure employed is so-called wet etching, which results in the cross-section of the etched circuit lines being trapezoidal.

If the spacing between the circuit lines in the design (specification) is increased to achieve a predetermined spacing d, then the density of circuit lines is necessarily decreased, which is undesirable. Thus, it is desirable to increase the thickness of the conductive layer in the through holes without thickening the conductive layer on the substrate surface.

Regarding prior attempts to solve the above problem, Japanese Published Unexamined Patent Application No. 2-174194 discloses a method for thickening metal layers in through holes. According to this method, the surface of a printed circuit board substrate, except for the interior surfaces of the through holes, is coated with a plating resist layer after plating metal onto the substrate surface, including the surfaces of the through holes. Thereafter, because of the presence of the plating resist layer, which prevents plating, metal is plated for a second time onto only the surfaces of the through holes.

When the above-described conventional technique is employed, however, there arises the following problem. In the conventional technique, since the second metal plating is carried out for the substrate with the plating resist layer being present, the plating resist gets mixed into the plating solution, thereby contaminating it, so that uniform plating cannot be attained and defects such as cracks in the plated metal often occur.

In addition to the above problem, the plating solution needs to be filtered over and over to remove contaminants from the plating solution. Furthermore, since plating conditions vary significantly depending upon the existence or absence of the plating resist layer, when the same plating facility is used, different plating conditions need to be established for the first and second platings, which complicates the manufacturing process.

Of course, the first and second platings may be performed in separate plating facilities to avoid contaminating the plating solution. That is, a plating facility dedicated to plating the substrate in the presence of the plating resist layer may be used.

SUMMARY OF THE INVENTION

One object of the present invention is to avoid the above-described plating solution contamination while providing a method for forming electrically conductive layers on chip carrier substrates having through holes or via holes, with the electrically conductive layers in the through holes or via holes being relatively thick and the electrically conductive layers on the surfaces of the substrates being relatively thin.

Another object of the present invention is to provide a method for forming substantially uniform electrically conductive layers, having relatively few defects, on chip carrier substrates containing through holes or via holes.

Still another object of the present invention is to provide a method for forming substantially uniform electrically conductive layers, having relatively few defects, on chip carrier substrates containing through holes or via holes, using a conventional plating process without requiring extra process steps such as removal of contaminants from the plating solution or reestablishment of plating conditions, or a new plating facility.

To accomplish the above objects, the present invention provides a method for forming a chip carrier, comprising the steps of: providing a substrate which includes first and second opposing surfaces and at least one through hole; forming a first electrically conductive layer overlying at least the first surface and a surface of the through hole; removing at least a portion of the first electrically conductive layer overlying the first surface; and forming a second electrically conductive layer overlying the first surface and the first conductive layer formed overlying the surface of the through hole.

In addition, the present invention provides a method for forming a chip carrier, comprising the steps of: providing a substrate which includes first and second opposing surfaces, at least one electrically conductive layer within the interior of the substrate and at least one via hole extending from the first surface to the conductive layer in the substrate; forming a first electrically conductive layer overlying the first surface of the substrate and a surface of the via hole; removing at least a portion of the first electrically conductive layer overlying the first surface of the substrate; and forming a second electrically conductive layer overlying the first surface of the substrate and the first conductive layer overlying the surface of the via hole.

Significantly, in accordance with the present invention, in the embodiment involving, for example, through holes, the step of removing the first electrically conductive layer formed on a chip carrier substrate including a through hole comprises the substeps of: forming an etch mask on the first conductive layer overlying the first surface of the substrate and the first conductive layer overlying the surface of the through hole; removing the etch mask overlying the first surface; and removing the first conductive layer overlying the first surface by etching.

BRIEF DESCRIPTION OF THE DRAWINGS

The invention is described with reference to the accompanying drawings, wherein:

FIG. 8 is a cross-sectional view of the chip carrier substrate of FIG. 7 after being copper plated in accordance with the second copper plating step (6) of FIG. 1;

FIG. 9 is a cross-sectional view of the chip carrier substrate of FIG. 8 after circuit patterns are formed on the upper and lower surfaces thereof;

FIG. 10 is a cross-sectional view of a chip carrier substrate processed in accordance with the present invention, depicting a circuit pattern thereof;

DETAILED DESCRIPTION OF THE PREFERRED EMBODIMENT(S)

Preferred embodiments of the of the present invention are described with reference to FIGS. 1 through 20. While separate descriptions are provided for a chip carrier substrate with through holes, and a chip carrier substrate with via holes, it is a matter of course that the present invention is applicable to a chip carrier substrate with both through holes and via holes. In addition, while the following descriptions assume metal deposition is accomplished using a plating process, the method of the present invention is not limited to this particular metal deposition process, but rather any process which can form a conductive layer on a chip carrier substrate is useful.

A first preferred embodiment of the inventive method, used in connection with a chip carrier substrate having through holes, is described below with reference to FIGS. 1 through 12.

Figure 1:
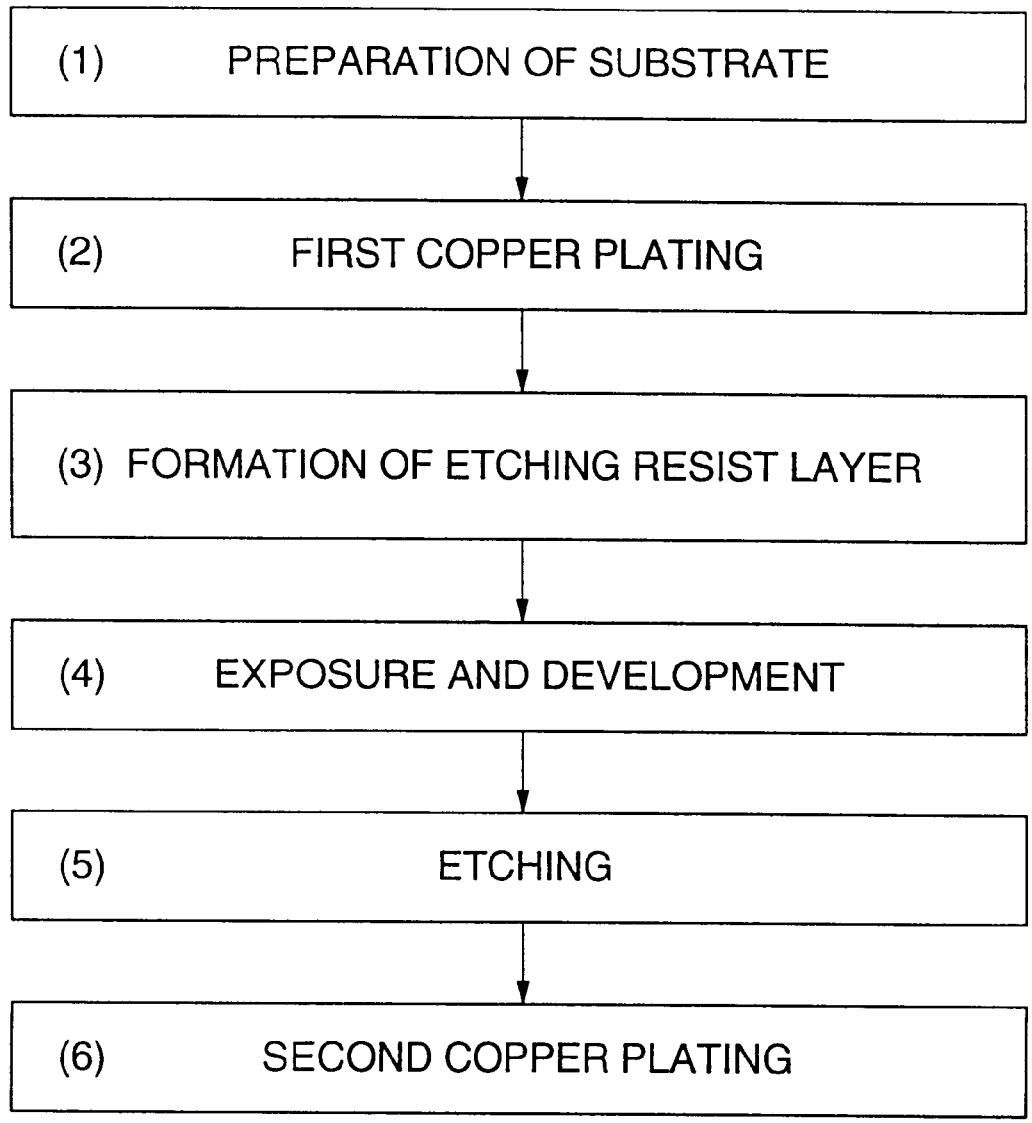
FIG. 1 is a flowchart showing the process steps associated with the present invention.

FIG. 1 is a flowchart illustrating the sequence of steps associated with the method according to the present invention. This flowchart is applicable to both the first and second preferred embodiments of the invention. Thus, in the first preferred embodiment, the step of preparing the substrate involves providing a substrate on which a conductive layer is to be formed by the method of the present invention (FIG. 2) (step (1) of FIG. 1). The substrate used is generally one obtained by processing a layer of insulating material, such as epoxy resin, having two opposed surfaces to which copper foils are applied. The substrate may be a multilayer substrate in which a circuit pattern is formed in each of the foils, or a so-called composite substrate in which a plurality of insulating materials are combined. In addition, the copper foils need not be applied.

Through holes are drilled, e.g., mechanically drilled, through predetermined positions of the substrate for establishing electrical connections between the circuit patterns on the two opposed surfaces of the substrate. The holes are formed to typically have a diameter of about 0.3–0.8 mm. In the case where the holes are to be very small, holes with diameters of about 0.2 mm may be drilled.

Figure 2:
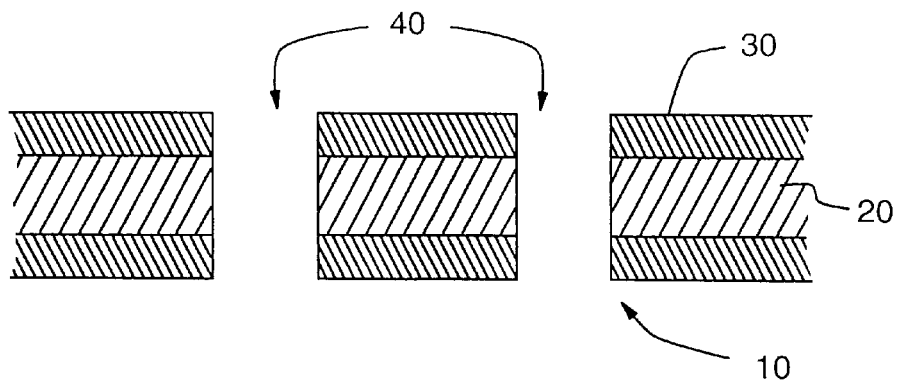
FIG. 2 is a cross-sectional view of a chip carrier substrate prepared in accordance with preparation step (1) of FIG. 1 and drilled with through holes.

FIG. 2 shows a cross-sectional view of a chip carrier substrate 10 drilled with through holes. In FIG. 2, copper foil 30 has been applied to each of the upper and lower surfaces of the layer 20 of insulating material. The thickness of the copper foil is typically about 18–70 μm. Through holes 40 passing through this substrate are formed. In the cross-sectional views shown in FIG. 2 and the following figures the diameters of holes, the thicknesses of layers, etc. are not drawn to scale so as to more clearly indicate the respective situations.

Figure 3:
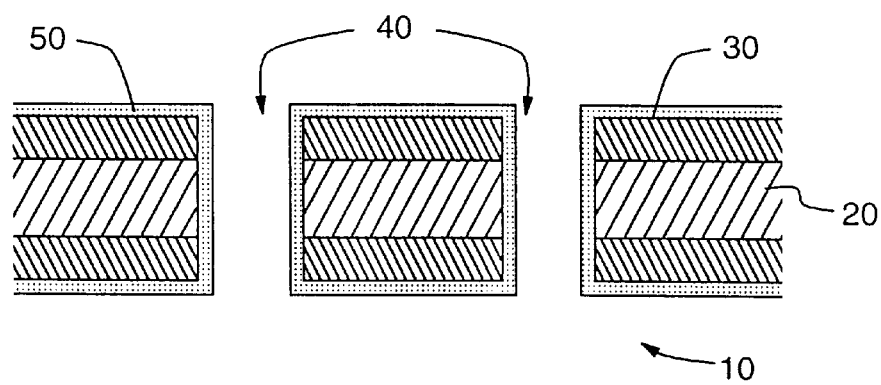
FIG. 3 is a cross-sectional view of the chip carrier substrate of FIG. 2 copper plated in accordance with the first copper plating step (2) of FIG. 1.

In the first copper plating step, copper is plated onto the entire surface of the substrate, after degreasing and rinsing the substrate (step (2) of FIG. 1). The copper plating is carried out by conventional electroless plating or electrolytic plating. FIG. 3 shows a cross-section of the substrate 10 after being copper plated during this step. A copper plated layer 50 is formed over the entire substrate. It should be noted here that since the through holes 40 have relatively small diameters, it is difficult to supply the plating solution into the through holes so that the copper plated layer on the surfaces of the through holes is thinner than that on the copper foil 30 on the surface of the substrate.

Figure 4:
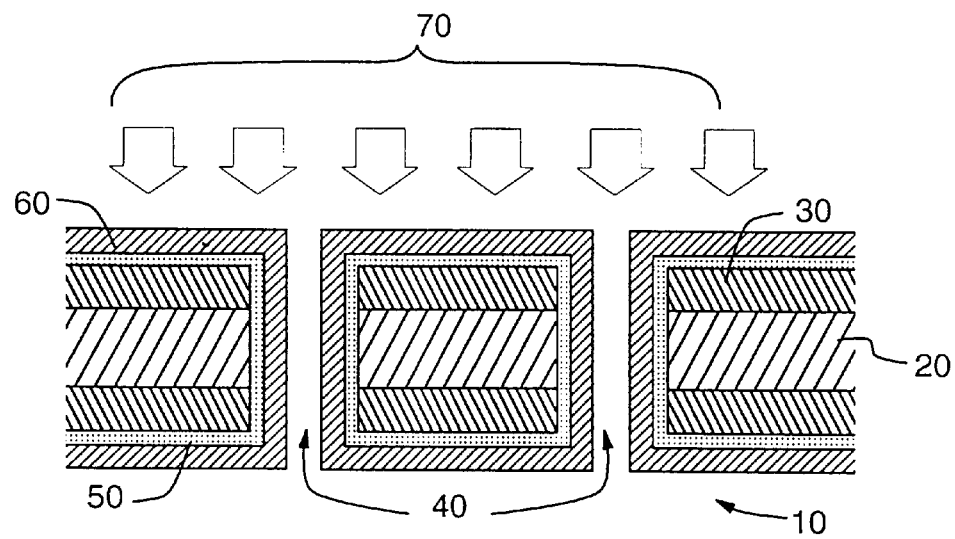
FIG. 4 is a cross-sectional view of the chip carrier substrate of FIG. 3 modified to include an etching resist layer in accordance with the etching resist formation step (3) of FIG. 1.

In the step of forming an etching resist layer, i.e., a resist layer which serves as an etch mask, an etching resist layer is formed on the copper plated layer on the substrate (step (3) of FIG. 1). The etching resist used herein is photosensitive resist (photoresist) composed of organic compounds, and preferably a so-called positive photoresist which exhibits etching resistance in areas not exposed to light. FIG. 4 shows a cross-section of the substrate 10 on which an etching resist layer 60 has been formed during this step. The etching resist layer 60 is substantially uniformly formed over the copper plated layer 50.

In the step of exposure and development, the substrate 10 formed with the etching resist layer 60 is exposed and developed (step (4) of FIG. 1). It should be noted that, as shown by reference 70 in FIG. 4, light is projected substantially perpendicularly to the surface of the substrate, i.e., the light beam is projected substantially parallel to the surface of the through hole. This enables the light beam to expose only the etching resist layer on the surface of the substrate without exposing the etching resist layer on the inner surface of the through holes. It should also be noted that this exposure step does not require a mask which is necessary in the conventional exposure step.

Figure 5:
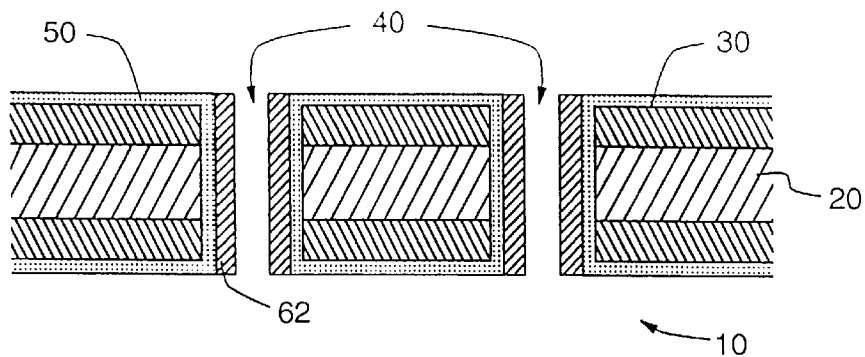
FIG. 5 is a cross-sectional view of the chip carrier substrate of FIG. 4 after the etching resist layer has undergone the exposure and development step (4) of FIG. 1.

The exposed substrate is developed in a developing solution such as sodium carbonate solution or sodium metasilicate solution to remove only the exposed etching resist layer on the surface of the substrate. FIG. 5 shows a cross-section of the substrate 10 after the development procedure. In FIG. 5, the etching resist layer on the surface of the substrate is removed except for that on the surfaces of through holes 62.

Figure 6:
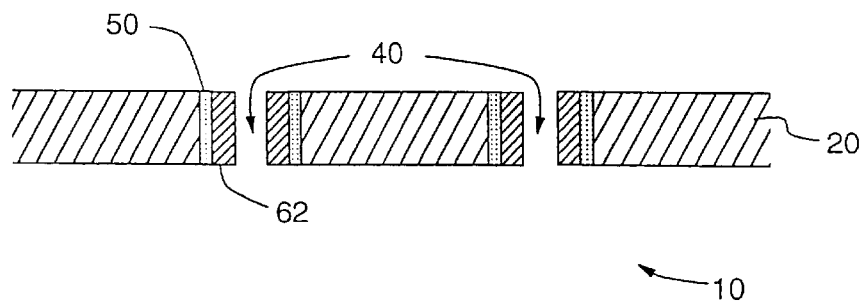
FIG. 6 is a cross-sectional view of the chip carrier substrate of FIG. 5 after the etching step (5) of FIG. 1.
Figure 7:
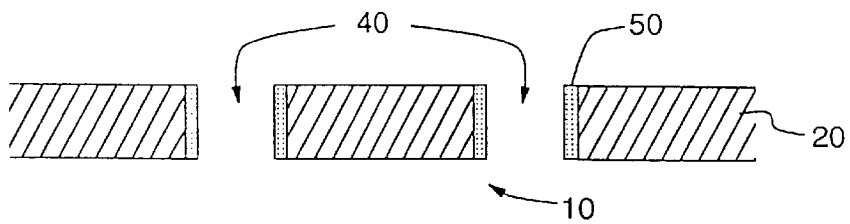
FIG. 7 is a cross-sectional view of the chip carrier substrate of FIG. 6 after the etching resist layer has been removed in accordance with the etching step (5) of FIG. 1.

In the etching step, the copper plated layer not covered by the etching resist layer 62 is removed by etching (step (5) of FIG. 1). Etching is performed by conventional wet etching using an acid solution of, for example, ferric chloride or cupric chloride as the etchant. FIG. 6 shows a cross-section of the substrate 10 shown in FIG. 5 after etching. In FIG. 6, it should be noted that copper on all regions not covered by the etching resist layer 62 has been etched away, that is, not only the copper plated layer 50 on the surface of the substrate in FIG. 5 but also the copper foil 30 has been etched away. This permits a relatively thin copper plated layer to be formed on the surface of the substrate in the second copper plating step, described below. Then, the etching resist layer 62 of FIG. 6 is removed by applying, for example, sodium hydrate solution. FIG. 7 shows a cross-section of the substrate after the etching resist layer 62 has been removed.

In the second copper plating step, copper is plated over the entire substrate, after degreasing and rinsing (step (6) of FIG. 1). The copper plating is carried out by, for example, conventional electroless plating or electrolytic plating, as in the first copper plating step. It should be noted that in the second copper plating step, since the copper plating is not performed on the substrate formed with a plating resist layer as in the conventional method, the conditions used for the first copper plating can be utilized substantially unchanged. That is, the copper plating can be performed using the same plating facility as for the first plating under substantially the same conditions. It is also important to note that the problem found in the conventional method, i.e., that uniform plating cannot be performed because the plating resist gets mixed into the plating solution to contaminate it, does not arise. Consequently, defects such as cracks (which lead to open circuits) do not arise in the plating layer.

FIG. 8 shows a cross-section of the substrate 10 copper plated in accordance with the second copper plating step. In FIG. 8, the copper plated layer 52 is formed over the entire substrate. Thus, the copper plated layer on the inner surface of each through hole 40 has a thickness which includes the thickness of the copper plated layer 50 formed during the first copper plating step and that of the copper plated layer 52 formed during the second copper plating. Thus, an object of the present invention is attained because the conductive layer on the surface of the substrate is relatively thin while the conductive layer in each through hole is relatively thick.

The copper plated layer 52 on the surface of the substrate can be formed to be as thin as, for example, 10 μm. On the other hand, the conductive layer in each through hole can be formed to be as thick as, for example, 20 μm or more. Accordingly, the thickness of the conductive layer in each through hole can be made two times or more the thickness of the copper plated layer on the surface of the substrate.

The substrate formed with the copper plated layer 52 of FIG. 8 is subsequently processed to form a circuit pattern 54, as shown in FIG. 9, on its surface through a series of steps such as resist application, exposure, development, and etching. The formation of circuit pattern 54 is performed as in the conventional method, and description thereof is omitted herein.

It should be noted here that, since the copper plated layer on the surface of the substrate is relatively thin, the previous problem of short circuiting is avoided. That is, when a copper plated layer is etched under the same design specifications for circuit pattern as shown in FIG. 10, for example, spacing "b" between the circuit lines 90 on the copper plated layer formed by the method according to the present invention can be made considerably wider than spacing "a" between the circuit lines 80 on the copper layer formed by the conventional method. In other words, this means that, when the method of the present invention is employed, the specifications for design of a circuit pattern can be made more severe, that is, the spacing between circuit lines can be made narrower in the specifications. Therefore, when the method of the present invention is employed, the density of circuit lines can be significantly increased.

In the above-mentioned step of forming the etching resist layer, instead of using a positive photoresist as the etching resist layer, one may use a dry film structure including photosensitive resin contained between a carrier film and a protective film.

Figure 11:
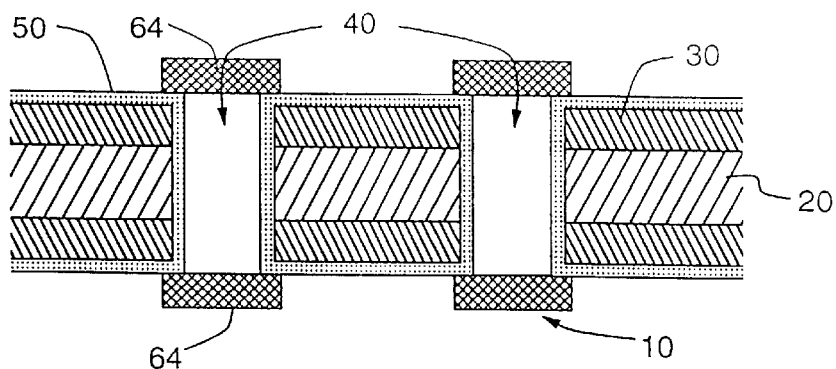
FIG. 11 is a cross-sectional view of the chip carrier substrate processed in accordance with the present invention where a dry film is used as the etching resist layer.

FIG. 11 shows an example using such a dry film. In FIG. 11, a patterned dry film 64 is provided on the surface of the substrate so as to completely cover the through holes 40.

Figure 12:
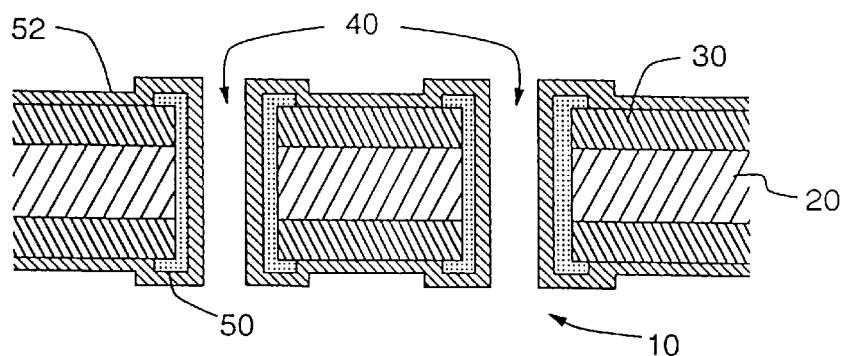
FIG. 12 is a cross-sectional view of the chip carrier substrate of FIG. 11 after being etched and formed with the second copper plated layer.
Figure 13:
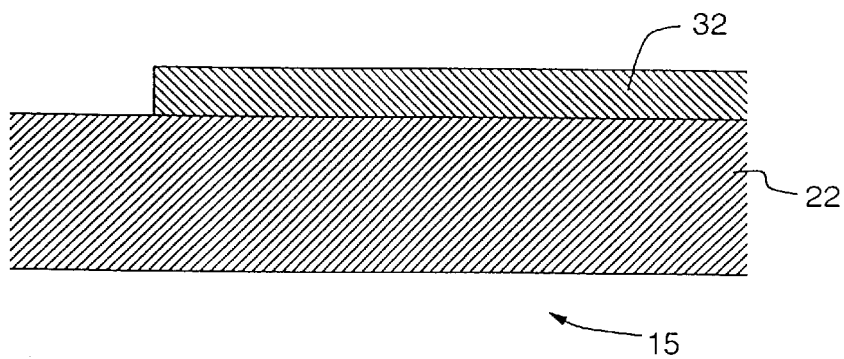
FIG. 13 is a cross-sectional view of a chip carrier substrate to which a copper foil has been applied, in the substrate preparation step (1) of FIG. 1.

When using the dry film, the copper plated layer 50 is then etched. However, since the dry film also covers the surface of the substrate around the through holes, as shown in FIG. 11, the copper plated layer is left unetched on the surface of the substrate around the through hole. Thus, when the copper plated layer 52 is formed in the second copper plating step, the copper plated layer on the surface of the substrate around the through hole becomes thicker, as shown in FIG. 12, so that a step is disadvantageously produced. Therefore, if the step in the copper plated layer around the through hole is not desirable, it is better to use the above-mentioned positive photoresist.

A second preferred embodiment of the inventive method, used in connection with a chip carrier substrate having via holes, is described below with reference to FIG. 1 and FIGS. 13 through 20.

First, the step of preparing the substrate involves providing a substrate on which a conductive layer is to be formed by the method of the present invention (step (1) of FIG. 1). In preparing the substrate, a copper foil 32 forming a conductive layer in what is to be the interior of the substrate is applied on the surface of a layer 22 obtained by treating an insulating material such as an epoxy resin. Instead of applying the copper foil on the insulating layer, a conductive layer such as copper may be formed on the insulating layer by a conductive layer forming process such as plating or sputtering.

Figure 14:
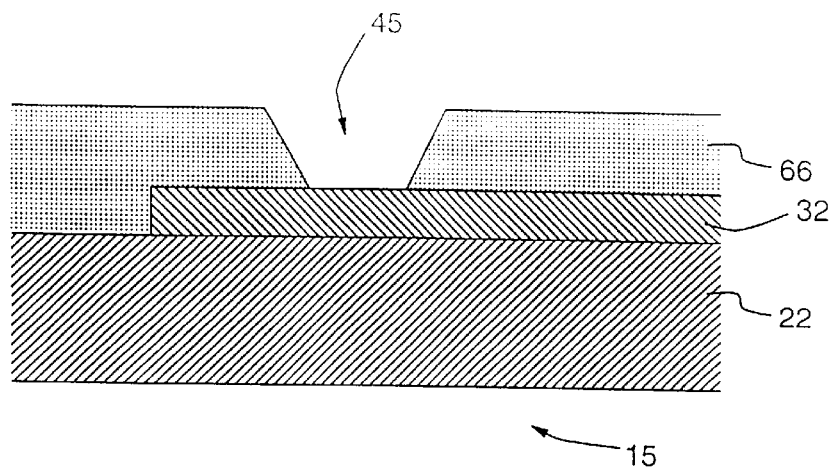
FIG. 14 is a cross-sectional view of a chip carrier substrate formed with a via hole in the substrate preparation step (1) of FIG. 1.

As shown in FIG. 14, after an insulating material 66 composed of, for example, a thermosetting polyimide or the like is applied to the combination of the insulating layer and the copper foil 32, a via hole 45 extending to the foil 32 is formed in the insulating material 66 by using conventional photolithographic techniques. Thus, as shown in FIG. 14, a substrate 15 having via holes is formed. In FIG. 14, the via hole 45 is shown having a trapezoidal cross-section, with a diameter of about 200 μm on the surface of the insulating material 66 and a diameter of about 125 μm on the surface of the copper foil 32.

It should be noted that, in cross-section, the via hole 45 need not be trapezoidal, but may have other shapes such as rectangular. In addition, a substrate with a via hole may be prepared by forming a hole from the surface of the substrate to the conductive layer in the substrate in a multilayer substrate previously prepared by using conventional photolithographic and etching processes.

Figure 15:
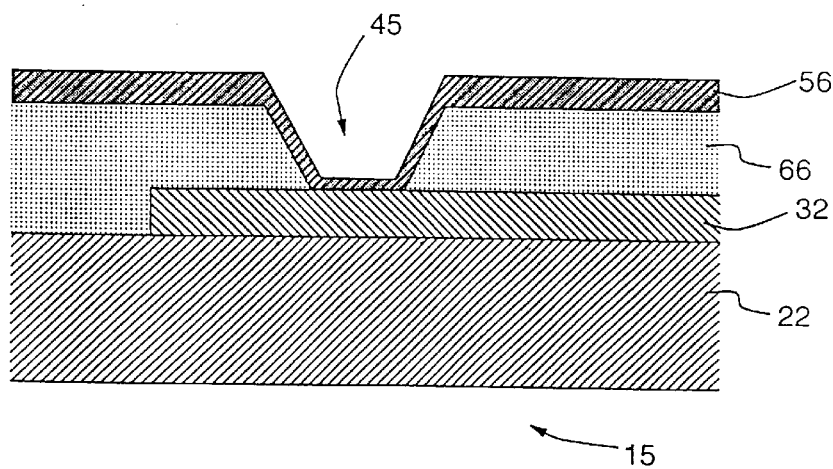
FIG. 15 is a cross-sectional view of the chip carrier substrate of FIG. 14 after being copper plated in accordance with the first copper plating step (2) of FIG. 1.

In the first copper plating step, copper is plated onto the entire surface of the substrate 15, after degreasing and rinsing the substrate 15 (step (2) of FIG. 1). The copper plating is carried out by conventional electrolytic plating or electroless plating. FIG. 15 shows a cross-section of the substrate 15 after being plated during this step. The copper plated layer 56 is formed over the entire substrate. It should be noted here that, since the via hole has a small diameter, it is difficult to supply the plating solution into the via hole so that the copper plated layer on the surface of the via hole 45 is thinner than that on the upper surface of the substrate.

Figure 16:
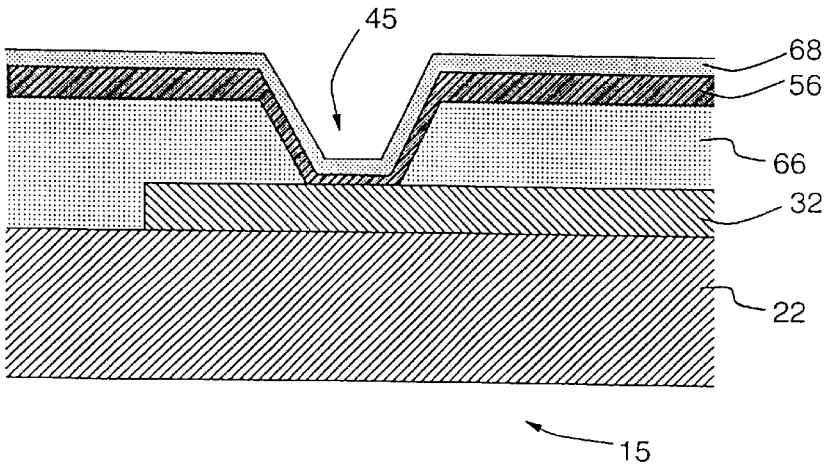
FIG. 16 is a cross-sectional view of the chip carrier substrate of FIG. 15 after being provided with an etching resist layer in accordance with the etching resist formation step (3) of FIG. 1.

In the step of forming an etching resist layer, i.e., a resist layer which serves as an etch mask, an etching resist layer is formed on the copper plated layer on the substrate (step (3) of FIG. 1). The etching resist used herein is photosensitive resist (photoresist) composed of organic compounds, and preferably a so-called positive photoresist which exhibits etching resistance in areas not exposed to light. FIG. 16 shows a cross-section of the substrate 15 on which an etching resist layer 68 has been formed during this step. The etching resist layer 68 is substantially uniformly formed over the copper plated layer 56.

In the step of exposure and development, the substrate 15 formed with the etching resist layer 68 is exposed and developed (step (4) of FIG. 1). The exposure is performed by a conventional exposure method using a mask with light transmission areas of a size corresponding to the via hole.

Figure 17:
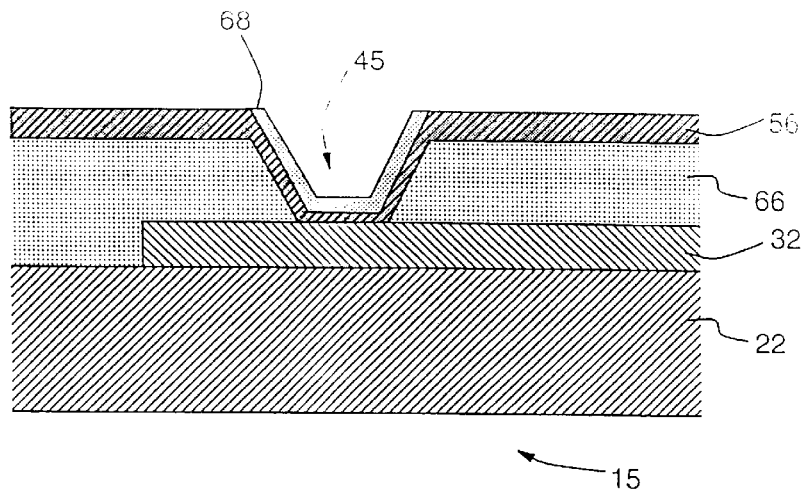
FIG. 17 is a cross-sectional view of the chip carrier substrate of FIG. 16 after the exposure and development step (4) of FIG. 1.

The exposed substrate is developed in developing solution such as sodium carbonate solution or sodium metasilicate solution to remove only the etching resist layer on the upper surface of substrate 15. FIG. 17 shows a cross-section of the substrate 15 after the development procedure. In FIG. 17, the etching resist layer on the surface of the substrate is removed while leaving only the etching resist layer 68 in the via hole 45.

Figure 18:
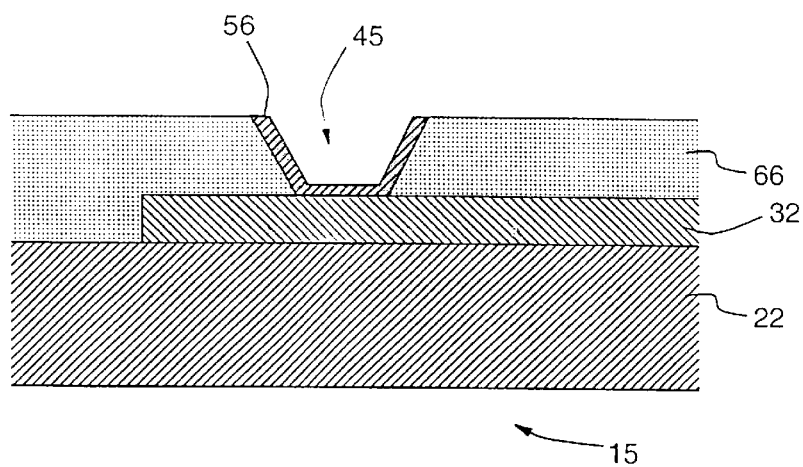
FIG. 18 is a cross-sectional view of the chip carrier substrate of FIG. 17 after it has been etched and from which the etching resist layer has been removed in accordance with the etching step (5) of FIG. 1.

In the etching step, the copper plated layer not covered by the etching resist layer 68 is removed by etching (step (5) of FIG. 1). Etching is performed by conventional wet etching using an acid solution of, for example, ferric chloride or cupric chloride as the etchant. After etching, the etching resist layer 68 on the substrate is removed by applying, for example, sodium hydrate solution. FIG. 18 shows a cross-section of the substrate after the etching resist layer 68 has been removed.

In the second copper plating step, copper is plated over the entire substrate, after degreasing and rinsing (step (6) of FIG. 1). The copper plating is carried out by, for example, conventional electroless plating or electrolytic plating as in the first copper plating step. It should be noted that in the second copper plating step, since the copper plating is not performed on the substrate formed with a plating resist layer as in the conventional method, the conditions used for the first copper plating can be utilized substantially unchanged. That is, the copper plating can be performed by using the same plating facility as for the first plating under substantially the same conditions. It is also important to note that the problem found in the conventional method, i.e., that uniform plating cannot be performed because the plating resist gets mixed into the plating solution to contaminate it, does not arise. Consequently, defects such as cracks (which lead to open circuits) do not arise in the plating layer.

Figure 19:
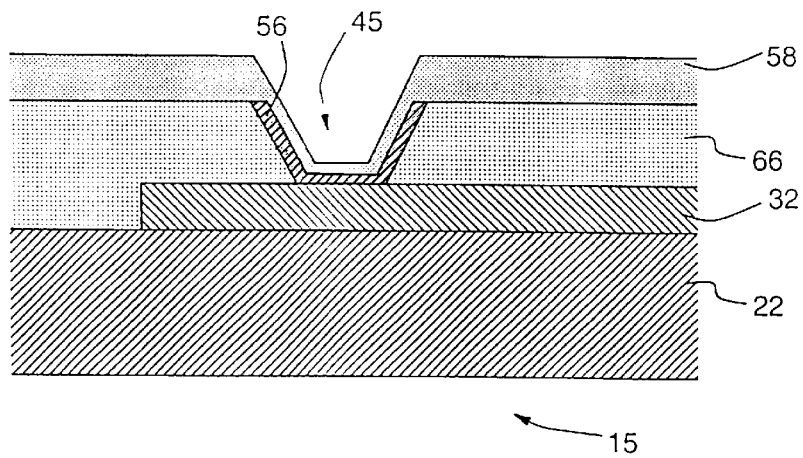
FIG. 19 is a cross-sectional view of the chip carrier substrate of FIG. 18 after being copper plated in accordance with the second copper plating step (6) of FIG. 1.

FIG. 19 shows a cross-section of the substrate 15 copper plated in accordance with the second copper plating step. In FIG. 19, the copper plated layer 58 is formed over the entire substrate. Thus, as in the above-mentioned case of the substrate with through holes, the copper plated layer in the via hole 45 has a thickness which includes the thickness of the copper plated layer 56 formed during the first copper plating step and the thickness of the copper plated layer 58 formed during the second copper plating step so that a thickness sufficient to assure a continuous electrical connection is achieved. Of course, the thickness of the copper plated layer on the surface of the substrate is only the thickness of the copper plated layer 58 formed during the second copper plating. Thus, an object of the present invention is attained because the conductive layer in the via hole is relatively thick while the conductive layer on the upper surface of the substrate is relatively thin.

The copper plated layer 58 on the surface of the substrate can be formed to be as thin as, for example, 10 μm. On the other hand, the conductive layer in the via hole can be formed to be as thick as, for example, 20 μm or more. Accordingly, the thickness of the conductive layer in the via hole can be made two times or more the thickness of the copper plated layer on the surface of the substrate as in the above-mentioned case of the substrate with a through hole.

Figure 20:
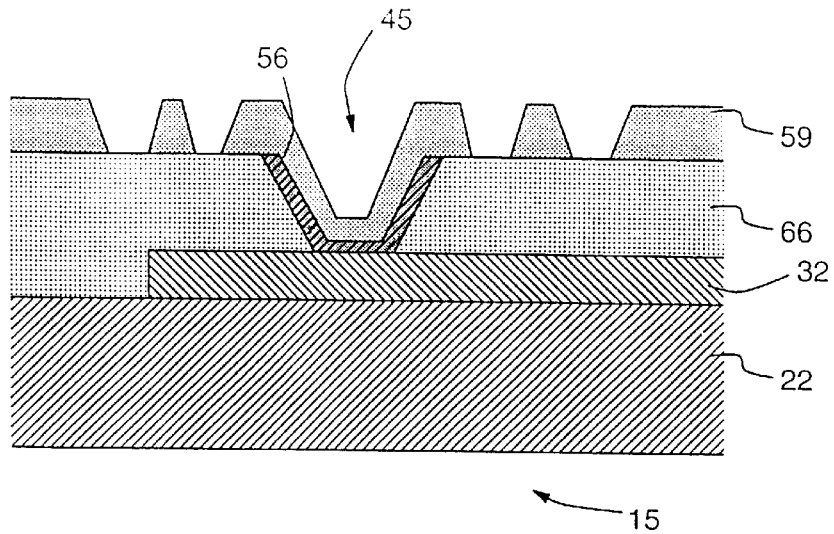
FIG. 20 is a cross-sectional view of the chip carrier substrate of FIG. 19 after a circuit pattern has been formed.
Figure 21:
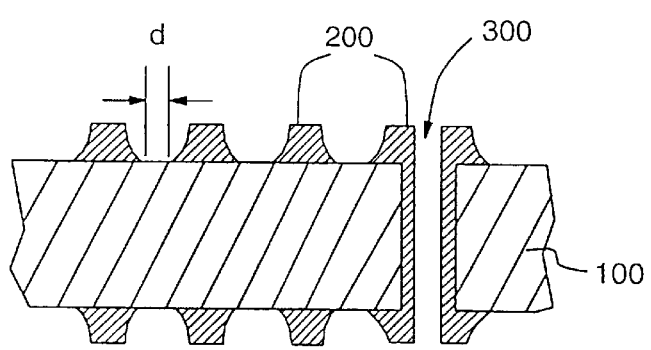
FIG. 21 is a sectional view of a chip carrier substrate formed using prior techniques after a circuit pattern has been formed.

The substrate formed with the copper plated layer 58 of FIG. 19 is subsequently processed to form a circuit pattern 59, as shown in FIG. 20, on its surface through a series of steps such as resist application, exposure, development, and etching. The formation of circuit pattern 59 is performed as in the conventional method, and description thereof is omitted herein.

Because the copper plated layer on the surface of the substrate is relatively thin, the previous problem of short circuiting is avoided even though the spacing between circuit lines is reduced. Therefore, when the method of the present invention is employed, as in the above-mentioned substrate with through holes, the density of circuit lines can be significantly increased.

In the above-mentioned step of forming the etching resist layer, instead of using a positive photoresist as in the etching resist layer, one may use a dry film, as in the substrate with through holes.

While the preferred embodiments of the invention have been described, the present invention is not limited to such embodiments, but may be variously modified within a scope not changing the spirit of the present invention. For example, the conductor formed on the substrate need not have a composition limited to copper (Cu), but may be of nickel (Ni), rhodium (Rh), gold (Au), or solder (Pb—Sn). The first conductor formed during the first plating need not have the same composition as the second conductor formed during the second plating. For example, the first and second platings may include different conductors such as copper and nickel, respectively. In addition, the method for forming the conductive layer is not limited to plating, but may be any process, including sputtering, which can form a conductive layer on a substrate with through holes and/or via holes.

As noted above, the present invention has the following advantages. Firstly, the conductive layer formed in a through hole or via hole is relatively thick, while the conductive layer formed on the upper surface of the substrate is relatively thin. Consequently, defects such as pinholes or cracks in the conductive layer of a through hole or a via hole are avoided so that a continuous electrical connection is provided. In addition, sufficient spacing can be provided between the circuit lines on the surface of the substrate so that density of circuit lines can be increased without causing short circuits.

Secondly, if plating is used as the method for forming the conductive layers, since it is not performed on a substrate formed with a plating resist layer on its upper surface, the plating resist does not get mixed in with the plating solution. Therefore, the plating resist layer does not contaminate the plating solution, preventing uniform plating. In addition, because the first and the second conductor platings can be performed under substantially the same plating conditions in the same plating facility, the manufacturing process is simplified.

What is claimed is:

1. A method for fabricating a chip carrier, comprising the steps of:

providing a substrate which includes first and second opposed surfaces and at least one hole in said substrate, said hole including an inner surface;

forming a first electrically conductive layer, having a first thickness, directly on said first opposed surface of said substrate and on said inner surface of said hole;

removing all of said first electrically conductive layer from said first opposed surface of said substrate to expose said first opposed surface; and thereafter forming a second electrically conductive layer, having a second thickness, directly on said first opposed surface where said first electrically conductive layer has been removed, and on said first electrically conductive layer on said inner surface of said at least one hole.

2. The method of claim 1, wherein the step of providing said substrate further includes providing at least one electrically conductive layer between said first and second opposed surfaces of said substrate.

3. The method of claim 1, wherein each of said forming steps includes the step of electrolessly or electrolytically plating said electrically conductive layers.

4. The method of claim 1, wherein said removing all of said first electrically conductive layer includes the steps of:

forming an etch mask on said first electrically conductive layer on said first opposed surface of said substrate and on said inner surface of said hole;

removing said etch mask from said first electrically conductive layer on said first opposed surface; and thereafter removing all of said first electrically conductive layer from said first opposed surface by etching.

5. The method of claim 4, wherein said step of removing said etch mask includes the steps of:

exposing a photoresist using a light beam directed in a fashion so as not to expose said etch mask on said inner surface of said hole; and thereafter, removing said exposed photoresist on said first surface by developing said exposed photoresist.

6. The method of claim 4, wherein said etch mask is provided as a photoresist material.

7. The method of claim 6, wherein said photoresist is provided as a positive photoresist material.

8. The method of claim 1, further comprising the step of patterning said second electrically conductive layer on said first opposed surface of said substrate to form a circuit pattern.

9. The method of claim 1, where each of said first and second electrically conductive layers is provided as a composition selected from the group consisting of copper, nickel, rhodium, gold, tin, lead, and a combination of tin and lead.

10. The method of claim 1, wherein a sum of said first thickness of said first electrically conductive layer and said second thickness of said second electrically conductive layer is provided as at least twice said second thickness of said second electrically conductive layer.

11. The method of claim 1, wherein said chip carrier is provided as a printed circuit board.

12. A method for fabricating a chip carrier, comprising the steps of:

proveiding a substrate having a first surface;

positioning an electrically conductive foil on said first surface;

providing at least one hole in said electrically conductive foil and in said substrate, said hole including an inner surface;

forming a first electrically conductive layer on said electrically conductive foil and on said inner surface of said hole;

removing all of said first electrically conductive layer and said electrically conductive foil from said first surface of said substrate to expose said first surface of said substrate; and forming a second electrically conductive layer directly on said first surface of said substrate where said first electrically conductive layer and said electrically conductive foil has been removed, and on said first electrically conductive layer on said inner surface of said hole.

13. The method of claim 12, wherein the step of providing said substrate further includes providing at least one electrically conductive layer to said first surface of said substrate.

14. The method of claim 12, wherein each of said forming steps includes the step of electrolessly or electrolytically plating said electrically conductive layers.

15. The method of claim 12, wherein said removing all of said first electrically conductive layer includes the step of:

forming a positive photoresist layer on said first electrically conductive layer and on said inner surface of said hole;

exposing said positive photoresist layer using a light beam directed in a fashion so as to not expose said photoresist on said inner surface of said hole;

removing said photoresist layer from said first electrically conductive layer by developing said exposed photoresist layer; and thereafter removing all of said first electrically conductive layer and said electrically conductive foil, from said first opposed surface, by etching.

16. The method of claim 12, further comprising the step of patterning said second electrically conductive layer on said first opposed surface of said substrate to form a circuit pattern.

17. The method of claim 12, where each of said first and second electrically conductive layers is provided as a composition selected from the group consisting of copper nickel, rhodium, gold, tin, lead, and a combination of lead and tin.

18. The method of claim 12, wherein a sum of said first thickness of said first electrically conductive layer and said second thickness of said second electrically conductive layer is provided as at least twice said second thickness of said second electrically conductive layer.

19. The method of claim 12, wherein said chip carrier is provided as a printed circuit board.

* * * * *